United States Patent [19]

Mazin et al.

[11] Patent Number: 4,506,349

[45] Date of Patent: Mar. 19, 1985

[54] CROSS-COUPLED TRANSISTOR MEMORY CELL FOR MOS RANDOM ACCESS MEMORY OF REDUCED POWER DISSIPATION

[75] Inventors: Moshe Mazin; William E. Engeler, both of Scotia, N.Y.

[73] Assignee: General Electric Company, Schenectady, N.Y.

[21] Appl. No.: 451,689

[22] Filed: Dec. 20, 1982

[51] Int. Cl.³ .............................................. G11C 11/40
[52] U.S. Cl. .................................... 365/189; 365/154; 365/190; 307/449
[58] Field of Search ............... 365/189, 154, 182, 190, 365/230; 307/449

[56] References Cited

U.S. PATENT DOCUMENTS

| | | | |
|---|---|---|---|
| 3,521,242 | 7/1970 | Katz | 340/173 |
| 3,535,699 | 10/1970 | Gaensslen et al. | 340/173 |
| 3,967,252 | 6/1976 | Donnelly | 340/173 |
| 4,063,225 | 12/1977 | Stewart | 365/156 |
| 4,189,782 | 2/1980 | Dingwall | 365/190 |
| 4,251,876 | 2/1981 | McKenny et al. | 365/182 |
| 4,335,449 | 6/1982 | Nokubo | 365/177 |
| 4,459,683 | 7/1984 | Yalamanchili et al. | 365/154 |

*Primary Examiner*—Terrell W. Fears

*Attorney, Agent, or Firm*—Julius J. Zaskalicky; James C. Davis, Jr.; Marvin Snyder

[57] ABSTRACT

A memory cell of the general type employing one pair of IGFETs defining data nodes and cross-coupled in a latch circuit configuration for storing data, and another pair of IGFETs serving as transmission gates to selectively couple data into or out of the cell. A circuit technique provides fast writing speed by avoiding the use of load resistors in either the charge or discharge paths for the data nodes and yet ensures that the data nodes are pulled either fully to logic high or fully to logic low, as the case may be, without limitation by threshold voltage offset between the gate and source terminals of the IGFETs serving as transmission gates. High impedance leakage current discharge resistances are included, and serve only the function of discharging leakage at the nodes to maintain memory. In the disposed circuit configurations, the latch IGFETs are of opposite channel conductivity type compared to the gating IGFETs. Various alternative forms of suitable high impedance leakage current resistances are disclosed, including a resistive sea above the cell and leakage paths included within the gating IGFETs. The high impedance leakage current discharge resistances may be eliminated to provide a dynamic memory cell.

19 Claims, 5 Drawing Figures

CROSS-COUPLED TRANSISTOR MEMORY CELL FOR MOS RANDOM ACCESS MEMORY OF REDUCED POWER DISSIPATION

BACKGROUND OF THE INVENTION

The present invention relates generally to random-access memories of the type fabricated on a monolithic semiconductor chip employing insulated-gate field-effect transistors (IGFETs) and, more particularly, to a memory cell of the cross-coupled transistor type.

As is well known, a digital random access memory comprises a multiplicity of individual storage cells configured into a large array on an integrated circuit chip and suitably addressed, for example, by word and data bit lines. Each individual cell is capable, during a writing operation, of being set by an external signal into either one of two distinct states. So long as power supply voltage continues, the cell remains in the set state indefinitely, or until it is changed to the other state by a subsequent writing operation. The state of the cell can be sensed during a reading operation to retrieve stored data, preferably in a non-destructive manner, i.e., which does not change the state of the memory cell.

In the design of large memory arrays, important considerations are cell size (which influences the number of individual cells which can be fabricated on a single chip), power dissipation, and the speed at which information can be written into and read from the cell. In general, to achieve a small cell size, it is desirable to reduce to a minimum the number of transistors required per cell. Another consideration is that, in some memory cell types, a design compromise must be made between speed and power dissipation.

One general type of prior art static memory cell particularly pertinent in the context of the present invention is a four-transistor cell comprising two pairs of insulated-gate field-effect transistors (IGFETs), all four of the same channel conductivity type. Typically, four enhancement-mode N-channel IGFETs are employed. One pair of transistors in each cell are latch transistors, cross-coupled in a bistable latch configuration, and are connected for selectively switching ON and OFF a pair of paths to ground from a corresponding pair of complementary data input/output nodes. To accomplish this, the latch transistor drain terminals are connected to the data nodes, and the latch transistor source terminals are connected to ground. The other pair of transistors in each cell are gating transistors, and are selectively enabled, both at the same time, to respectively connect the two data nodes to external DATA and $\overline{\text{DATA}}$ lines for both writing data into and reading data from the cell. Cells of this type also include a pair of load resistors connected from a voltage supply line, e.g. $+V_{DD}$, to the data nodes. These resistors may comprise ordinary resistors, or may be implemented in various other ways. In many particular designs, it is convenient to fabricate the load resistors in the form of depletion-mode field-effect transistors with the gate of each depletion mode transistor coupled back to the source of the same transistor.

One example of such a prior art memory cell is described hereinbelow in greater detail with reference to FIG. 1. Further, examples of this general type of static memory cell are disclosed in the following U.S. patents: Donnelly U.S. Pat. No. 3,967,252; McKenny et al U.S. Pat. No. 4,251,876; and Nokubo U.S. Pat. No. 4,335,449.

For reasons explained in greater detail hereinbelow with reference to FIG. 1, in prior art static memory cells of this type the load resistors serve two distinct functions: (1) completing the charging of the data nodes up to the $+V_{DD}$ potential when a logic high (binary "1") is being written into a particular one of the data nodes; and (2) maintaining static memory by providing a current path from $+V_{DD}$ potential to the pair of cross-coupled latch transistors.

The reason that the load resistors are required to serve the first function identified above is due to a threshold voltage ($V_T$) offset between the gate and source of the gating transistors when operated in the source follower mode, as discussed in greater detail hereinafter with reference to FIG. 1. However, it may briefly be stated here that, during the operation of writing a logic high into either of the data nodes, the corresponding gating transistor ceases conducting before the particular data node (or, more precisely, the parasitic capacitance associated with the data node) is fully charged to $+V_{DD}$ potential. To complete the charging, current must flow through the corresponding load resistor.

In view of this first-identified function served by the load resistors in prior art cells, a design compromise must be made between speed and power. In particular, if the value of the load resistance is lowered for greater speed, then a higher power dissipation results.

SUMMARY OF THE INVENTION

Accordingly, it is an overall object of the invention to provide a fast memory cell of the cross-coupled transistor type for low transistor count, and characterized by reduced power dissipation.

Briefly stated, and in accordance with an overall concept of the invention, a circuit technique is employed which avoids using resistors in either the charge or the discharge paths for the data nodes. While in the circuits of the subject invention very large resistances are used, the resistances function only to discharge leakage at the nodes. Thus, the resistances to not limit speed, and very high values (substantially greater than 250 megaohms) can be employed for low power dissipation, without compromising writing speed.

More particularly, in accordance with the invention it is recognized that the load resistors of prior art circuits can be entirely eliminated by employing, in each cell, gating transistors of opposite channel conductivity type compared to the cross-coupled latching transistors and relocating the latching transistors in circuit. As a result, in circuits of the subject invention, the threshold voltage offset of the gating transistors does not impair the writing of data into the cell. In the subject cells, when writing one logic level into a particular data node, the corresponding gating transistor operates in the common-source mode and remains fully on until the node is discharged or charged, as the case may be. At the same time, while writing data of the other (complementary) logic level into the other data node, the other gating transistor is operated in the source-follower mode and cuts off before the data node is fully charged or discharged, as the case may be. However, before this other gating transistor cuts off, the associated latching transistor begins conducting, to complete the operation of charging or discharging the other data node.

The present invention is not limited by the precise form of discharge resistances employed. However, in accordance with several more particular aspects of the invention, there are provided a variety of specific forms. In one form, the leakage current discharge paths comprise a resistive sea having portions in electrical contact with the data nodes, and a portion in electrical contact with circuit reference potential. In other forms, the leakage current discharge paths comprise leakage paths formed within the gating transistors, either between the data nodes and circuit reference potential, or between the data nodes and the corresponding DATA or $\overline{\text{DATA}}$ line.

Briefly, in accordance with one aspect of the invention, there is provided a binary memory cell for connection to first and second complementary data input/output lines and to a WORD line carrying cell-enabling signals for addressing the cell. The memory cell includes a pair of voltage supply nodes, one of which, for example, is a positive voltage supply node ($+V_{DD}$) with respect to the other, which is a circuit reference or ground voltage supply node. The cell additionally includes first and second complementary data input/output nodes.

Directly associated with the data nodes is a latch including a pair of IGFETs of one channel conductivity type, for example, P-channel IGFETs. The channel of one of the latch transistors is arranged to selectively electrically connect the first data node to the one supply voltage node ($+V_{DD}$), and the channel of the other latch transistor is arranged to selectively electrically connect the second data node to the one voltage supply node ($+V_{DD}$). The latch transistors are cross-coupled with the gate of the one latch transistor electrically connected to the second data node, and the gate of the other latch transistor electrically connected to the first data node.

First and second high impedance leakage current discharge paths respectively electrically connect the first and second data paths to the other voltage supply node, e.g., circuit reference potential.

The cell also has a gating circuit including a pair of IGFETs of opposite channel conductivity type, in this example, N-channel IGFETs. The channel of one gating transistor is arranged to selectively electrically connect the first data node to the first data line, and the channel of the other gating transistor is arranged to selectively electrically connect the second data node to the second data line. The gates of the gating transistors are both arranged for connection to the WORD line for controlling conduction through the channels of the gating transistors, which accordingly operate as transmission gates.

One particular memory cell structure in accordance with another aspect of the invention is included in an integrated circuit memory formed on a semiconductor substrate and including a pair of voltage supply lines, first and second complementary data input/output lines, and a WORD line carrying cell-enabling signals. The cell includes a pair of latch IGFETs of one channel conductivity type. Each latch transistor includes a source region and a drain region of the one conductivity type formed within the substrate, and an insulated gate electrode on the substrate configured for inducing a conduction channel between the source region and the drain region. The latch transistor source regions are electrically connected to each other and to one of the pair of voltage supply lines, e.g., $+V_{DD}$. The latch transistors are cross-coupled with the gate electrode of one of the latch transistors electrically connected to the drain region of the other latch transistor, and the gate electrode of the other latch transistor electrically connected to the drain region of the one latch transistor. In this configuration, the latch transistor drain regions respectively define first and second data input/output nodes.

The memory cell also includes a pair of gating IGFETs of opposite channel conductivity type. Each gating transistor includes a pair of main terminal regions of the opposite conductivity type formed within the substrate, and an insulated gate electrode on the substrate configured for inducing a conduction channel between the main terminal regions. In order to provide input to and output from the latch, one of the main terminal regions of one of the gating transistors is electrically connected to the first data line and the other of main terminal regions of the one gating transistor is electrically connected to the first transistor drain region. Similarly, one of the main terminal regions of the other gating transistors is electrically connected to the second data line, and the other of the main terminal regions of the other gating transistor is electrically connected to the second latch transistor drain region. The gate electrodes of the gating transistors are electrically connected to the WORD line for controlling conduction between the main terminal regions of the gating transistors.

Since both N-channel and P-channel IGFETs are formed on the same substrate, one of the pairs of transistors is formed within at least one well region of opposite conductivity type with respect to the channel conductivity type of the transistors of the one pair, and the well region is in turn formed within the substrate. Preferably, it is the gating transistors which are formed within a well region. In one particular example, the latch transistor are P-channel IGFETs formed directly within an $N^-$ conductivity type substrate, and the gating transistors are N-channel IGFETs formed within a $P^-$ conductivity type well region, in turn formed within the $N^-$ conductivity type substrate.

To complete the basic cell, first and second high impedance leakage current discharge paths are provided, respectively electrically connecting the first and second data nodes to the other of the pair of voltage supply lines, e.g., circuit reference potential.

In one specific form, the leakage current discharge paths comprise a layer, termed a resistive sea, of high-resistivity polycrystalline silicon covering at least portions of the substrate and electrically insulated from the substrate by an insulating layer. A ground electrode is provided in electrical contact with the high resistivity polycrystalline silicon layer and electrically connected to the other of the pair of voltage supply lines. First and second impedance electrodes extend respectively from a circuit point in electrical contact with the first and second data nodes through the insulating layer in electrical contact with the high-resistivity polycrystalline silicon layer. The impedance electrodes can extend either from the latch transistor drain regions, or from the gating transistor other main terminal regions.

In another form, the leakage current discharge paths comprise an electrical connection between the main terminal regions of the gating transistors connected to the drains of the latching transistors and the other of the voltage supply lines such that a reverse-biased PN junction diode is defined within each of the gating transistors. The gating transistors are configured to have leakge through the thus-defined PN junction diodes sufficient to discharge leakage current on the nodes.

In yet another form of leakage current discharge path in accordance with the invention, the gating transistors are configured to have leakage between their main terminal regions sufficient to discharge leakage current on the data nodes when the data lines are held at the potential of the other voltage supply line.

One of the advantageous characteristics of the circuits of the invention is that the precise values of the high impedance leakage current discharge resistances is extremely non-critical, so long as the leakage current discharge function is satisfied. Typically, the leakage current discharge resistors can have values in the thousands of megohms range.

In a further embodiment of the invention, the high impedance leakage current discharge resistances may be eliminated to provide a dynamic memory cell.

BRIEF DESCRIPTION OF THE DRAWINGS

While the novel features of the invention are set forth with particularity in the appended claims, the invention, both as to organization and content, will be better understood and appreciated, along with other object and features thereof, from the following detailed description taken in conjunction with the drawings, in which:

DETAILED DESCRIPTION

Figure 1:
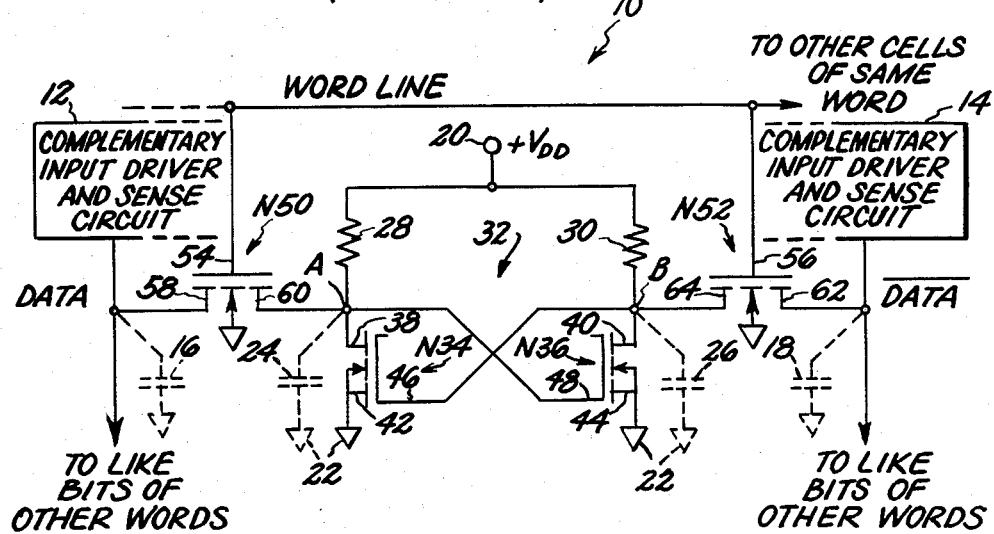
FIG. 1 is an electrical schematic diagram of a prior art memory cell of the cross-coupled IGFET type.

It is believed that the invention, its operation and its advantages will be better understood in view of a preliminary review of the characteristics of IGFETs of the type employed in static memory cells. It will be appreciated that the term insulated-gate field-effect transistor (IGFET) is employed herein a generic sense to include various similar field-effect transistor devices such as metal-oxide-semiconductor field-effect transistors (MOSFETs) and metal-insulator-semiconductor field-effect transistors (MISFETs).

In the FIGS., only enhancement-mode IGFETs are shown, designated in conventional fashion by means of a broken channel bar symbol. An N-channel IGFET is indicated by an arrow extending inward to the central element of the broken bar and a P-channel IGFET is indicated by an arrow extending outward from the central element of the broken bar. Also, for convenience, P-channel IGFETs are further identified by the letter P followed by a particular reference numeral, and N-channel IGFETs are further identified by the letter N followed by a particular reference numeral.

In further pertinent review, each IGFET has a pair of main terminals (source and drain) which define the ends of its conduction channel, as well as a gate electrode, the applied potential on which determines the conductivity of the conduction channel. For a P-channel IGFET, the source terminal is defined as that one of the main terminals having the more positive (higher) voltage potential applied thereto. For an N-channel IGFET, the source terminal is defined as that one of the main electrodes having the more negative (lower) voltage potential applied thereto. In either case, conduction occurs when the applied gate-to-source potential ($V_{GS}$) is both of the proper polarity to turn on the transistor, and is greater in magnitude than the threshold voltage $V_T$ of the particular transistor. The requirement that the gate-to-source potential exceed the threshold potential $V_T$ to turn ON an IGFET may for convenience be termed "threshold voltage $V_T$ offset", and relates to a significant aspect of the present invention.

To turn on a P-channel IGFET, the gate voltage ($V_G$) must be more negative than the source voltage $V_S$ by at least $V_T$. To turn on an N-channel IGFET, $V_G$ must be more positive than $V_S$ by at least $V_T$.

The IGFETs employed are essentially symmetrical devices in structure wherein the source and drain regions may be interchanged. In the case of the latching transistors, one main terminal is always the source, and is so schematically represented by placement of the gate terminal at the source end of the device. In the case of the gating transistors, it is not strictly possible to designate which main terminal is the source and which is the drain because, in operation, they alternate in view of the operation of the gating transistors in a transmission gate mode.

Finally, it should be noted that in the following discussion a potential at, or near, ground is arbitrarily defined as logic "low" (or binary "0"), and any potential at or near $+V_{DD}$ volts is arbitrarily defined as logic "high" (binary "1").

It is believed that the present invention will be better understood and appreciated in view of a specific electrical circuit representative of prior art memory cells. Accordingly, a prior art static memory cell of the type summarized above is described next in detail with reference to FIG. 1.

FIG. 1 is an electrical schematic diagram of a single prior art memory cell 10 which, as will be understood by those skilled in the art, is a small portion of a complete random access memory including an array of many such cells arranged in rows and columns in a conventional manner, and organized into a plurality of memory words each having a number of individual cells corresponding to the number of bits per word.

Considering first the circuitry external to the cell 10 required to operate the cell, the cell 10 is addressed or enabled by a WORD line which is driven by suitable circuitry (not shown), and which is also connected to all other cells of the same memory word. Also connected to the cell 10 are complementary DATA and $\overline{\text{DATA}}$ lines used for input and output. The DATA and $\overline{\text{DATA}}$ lines are connected to a complementary input driver and sense circuit, designated schematically in two circuitry parts 12 and 14. Associated with the DATA and $\overline{\text{DATA}}$ lines are parasitic capacitances schematically depicted in phantom lines as capacitors 16 and 18.

For writing data into the memory cell 10, the circuitry 12 and 14 functions as a complementary driver to place appropriate logic levels on the DATA and $\overline{\text{DATA}}$ lines. For writing, the DATA and $\overline{\text{DATA}}$ lines are complements of each other. For example, for writing a binary "1", the DATA line is driven high, while the $\overline{\text{DATA}}$ line is driven low. At the same time, immediately following, the cell 10 is addressed or enabled by suitably driving the WORD line. The particular cell 10 is enabled when the WORD line is at logic high.

The circuitry 12 and 14 also functions to read data stored in the cell 10 by sensing voltage levels on the DATA and $\overline{\text{DATA}}$ lines at the same time the WORD line is driven high, following a precharge operation, described hereinafter.

Considering the memmory cell 10 itself, the cell 10 includes a pair of voltage supply nodes 20 and 22, which may also be viewed as voltage supply lines of the overall integrated circuit memory. In the memory cell 10, one of the voltage supply nodes 20 is at $+V_{DD}$ potential, for example, $+5$ volts, and the other node 22 is at circuit reference or ground potential.

The cell includes first and second complementary data input/output nodes A and B corresponding respectively to the DATA and $\overline{\text{DATA}}$ lines. Parasitic capacitances are associated with the data nodes A and B, these capacitances being schematically represented by fixed capacitors 24 and 26 shown in phantom. Load resistors 28 and 30 electrically connect the nodes A and B, respectively, to $+V_{DD}$. Also connected to the nodes A and B and supplied through the load resistors 28 and 30 is a latch, generally designated 32, comprising a pair of cross-coupled N-channel IGFETs N34 and N36. The channels of the IGFETs N34 and N36 are respectively arranged to selectively connect the corresponding data node A or B to circuit reference potential 22 when gated ON. Accordingly, the latch transistor N34 and N36 drain terminals 38 and 40 are connected to the data nodes A and B, and the source terminals 42 and 44 are connected to circuit reference potential. To provide the latching function, the IGFETs N34 and N36 are cross-coupled, the gate 46 of one IGFET N34 being coupled to the node B and thus to the drain 40 of the other IGFET N36, and the gate 48 of the other IGFET N36 being coupled to the node A and thus to the drain 38 of the one IGFET N34.

As thus far described, it will be appreciated that the load resistors 28 and 30, and the cross-coupled IGFETs N34 and N36 comprise a bistable latch serving to maintain complementary data on the data nodes A and B. Assuming the data node A is high and the data node B is low, the transistor N36 is ON because its gate voltage is more positive than its source voltage. With transistor N36 ON, data node B is maintained at logic low. Since the gate 46 of transistor N34 is connected to node B, transistor N34 is OFF, allowing node A to be pulled to logic high through the load resistor 28. Alternatively, the latch 32 will maintain node A at logic low and node B at logic high in complementary fashion.

For coupling data into and out of the cell 10, there is a gating circuit comprising a pair of N-channel IGFETs N50 and N52 having their channels arranged to selectively connect the DATA line to data node A and the $\overline{\text{DATA}}$ line to data node B. Thus, the gating transistors N50 and N52 function as transmission gates. Their gate terminals 54 and 56 are connected to the WORD line so as to be enabled when the WORD line is at logic high. The main terminals 58 and 60 of the one gating transistor 50 and the main terminals 62 and 64 of the other gating transistor N52 are not designated as either source or drain because the terminals of each transistor N50 or N52 alternate function during normal operation of the memory cell 10.

The operation of the memory cell 10 is described next, beginning first with a description of the reading operation, followed by a description of the writing operation.

For purposes of example, it may be assumed that a binary "0" has previously been stored in the cell 10, and that accordingly the data node A is initially at logic low and the data node B initially is at logic high. The WORD line is low, and thus the gating transistors N50 and N52 are OFF. To begin a reading cycle, the circuitry 12 and 14 precharges both the DATA and $\overline{\text{DATA}}$ lines high or, more particularly, charges the parasitic capacitances 16 and 18. The circuitry 12 and 14 then allows the DATA and $\overline{\text{DATA}}$ lines to float, and prepares to sense the logic levels on the DATA and $\overline{\text{DATA}}$ lines. The WORD line is then driven high, allowing the gating transistors N50 and N52 to turn ON. In this situation, the terminal 60 of the N-channel IGFET N50 is a lower potential than the terminal 58, and the terminal 60 may accordingly be considered the transistor N50 source terminal. The transistor N50 gate 54 being more positive than the source terminal 60 because the WORD line is high, the transistor N50 turns fully on, pulling the DATA line to the reference potential on 22 through transistors N50 and N34, and discharging the parasitic capacitance 16. This is sensed by the sense circuit 12, which recognizes that a logic low is stored in the cell 10. Considering the $\overline{\text{DATA}}$ line side of the cell 10, since the node B is at logic high, there is no discharge path for the $\overline{\text{DATA}}$ line, which accordingly remains at logic high. Moreover, the gating transistor N52 does not even conduct because its gate 56 is not more positive than either of the terminals 62 or 64 by at least its threshold voltage $V_T$.

Considering briefly the complementary example, when a binary "1" is stored in the cell 10, the data node A is at logic high and the data node B is at logic low. Reading proceeds in the same manner, except that transistors N52 and N36 conduct to discharge the $\overline{\text{DATA}}$ line and the parasitic capacitor 18, while transistors N50 and N34 remain non-conducting.

Considering now the operation of writing into the prior art memory cell 10, in general, to write the data into the cell 10 the circuit 12 and 14 drives the DATA and $\overline{\text{DATA}}$ lines with complementary data in accordance with the binary number to be written into the cell 10. At the same time, or immediately thereafter, the WORD line goes high, turning on the gating transistors N50 and N52. The gating transistor N50 electrically connects the DATA line to data node A, and the gating transistor N52 electrically connects the $\overline{\text{DATA}}$ line to the data node B. The data nodes A and B are accordingly forced to the desired respective logic levels consistent with those on the DATA and $\overline{\text{DATA}}$ lines respectively, and so remain by the above-described latching operation when the gating transistors N50 and N52 are subsequently turned OFF.

While the foregoing is a sufficient general description of the writing operation, there is a significant subtlety involved when writing a logic high to either of the nodes A or B. For reasons explained next below, when writing a logic high to either of the data nodes A or B it is not possible for the particular data node A or B to be fully driven high, i.e., all the way to $+V_{DD}$, through the associated gating transistor N50 or N52, and the corresponding load resistor 28 or 30 must be relied upon to complete the writing operation by pulling the data node A or B up to $+V_{DD}$.

More particularly, when writing a logic high to a particular data node A or B, the associated gating transistor N50 or N52 operates in the source-follower mode, and the requirement that the threshold voltage $V_T$ between its gate and source be exceeded for the transistor to conduct causes the transistor to turn OFF before the particular data node A or B is fully charged.

By way of specific example, it will be assumed that, prior to an exemplary reading operation, a binary "0" has been stored in the cell 10 such that the node A is at logic low with the parasitic capacitance 24 discharged, and the data node B is at logic high with the parasitic capacitance 26 charged. Transistor N34 is ON and transistor N36 is OFF. The object of the exemplary writing operation is to turn the transistor N34 OFF and turn the transistor N36 On by forcing the data node A to logic high ($+V_{DD}$) and charging the parasitic capacitance 24, and forcing the data node B to logic low and discharging the parasitic capacitance 26. Thus, the driver circuitry 12 and 14 drives the DATA and $\overline{\text{DATA}}$ lines to logic high and logic low respectively, and the WORD line is driven to logic high.

Considering first the data node B, gating transistor N52 terminal 62 is negative with respect to terminal 64, and the terminal 62 therefore functions as the source terminal and the transistor N52 operates as in a common-source circuit configuration (for convenience referred to herein as "common-source mode"). The transistor N52 turns ON, discharging the parasitic capacitance 26 and pulling the data node B to logic low. Since the gate 46 of latch transistor N34 is coupled to the data node B, the transistor N34 turns OFF as the data node B goes low, allowing the data node A to go high (when suitably driven high). So long as the WORD line is high and the $\overline{\text{DATA}}$ line is low as the writing operation continues, the transistor N52 remains fully ON because the gate 56 and source 62 remain respectively at logic high and logic low potentials, and the gate 56 is accordingly always more positive than the source by at least $V_T$.

To continue this example of writing into the prior art cell 10, the data node A, which is being driven to logic high, is now considered. The gating transistor N50 terminal 60 is negative with respect to terminal 58, and the terminal 60 therefore functions as the source terminal, and the transistor N50 operates as in a source-follower circuit configuration (for convenience referred to herein as "source-follower mode"). Initially, the transistor N50 gate 54 is clearly more positive than the source terminal 60, since the gate terminal 54 is fully at logic high and the source terminal 60 is fully at logic low. The data node A (or, more particularly, the parasitic capacitance 24) begins to charge towards $+V_{DD}$ through the gating transistor N50. (As described above with reference to data node B, the latch transistor N34 is being turned OFF, to allow this.) However, at some point, as the voltage at node A and on the transistor N50 source terminal 60 approaches $+V_{DD}$, the difference between the transistor N50 gate 54 and source 60 voltages decreases to the threshold voltage $V_t$, eventually turning off the transistor N50.

Thus, in the FIG. 1 prior art memory cell 10, node A (and its parasitic capacitance 24) cannot be charged through gating transistor N50 any higher than a voltage equal to ($V_{DD} - V_T$). The charging of node A and the associated parasitic capacitance 24 above that value, i.e. up to $+V_{DD}$, can only be done through the load resistor 28. For a given speed, the value of the load resistor 28 connected to the node A is determined.

For the opposite case, i.e., when the data node A is initially at logic high and the data node B is initially at logic low, and it is desired to write a binary "0" into the cell 10, the operation proceeds in complementary fashion, with the operation of the gating transistors N50 and N52 reversed. In this case, the operation of pulling the data node B all the way to logic high ($+V_{DD}$) must be completed through the load resistor 30.

In summary, while the prior art memory cell 10 has the advantage of relatively low transistor count, it has the disadvantage that a design compromise must be made between the writing speed and the value of the load resistors 28 and 30.

Figure 2:
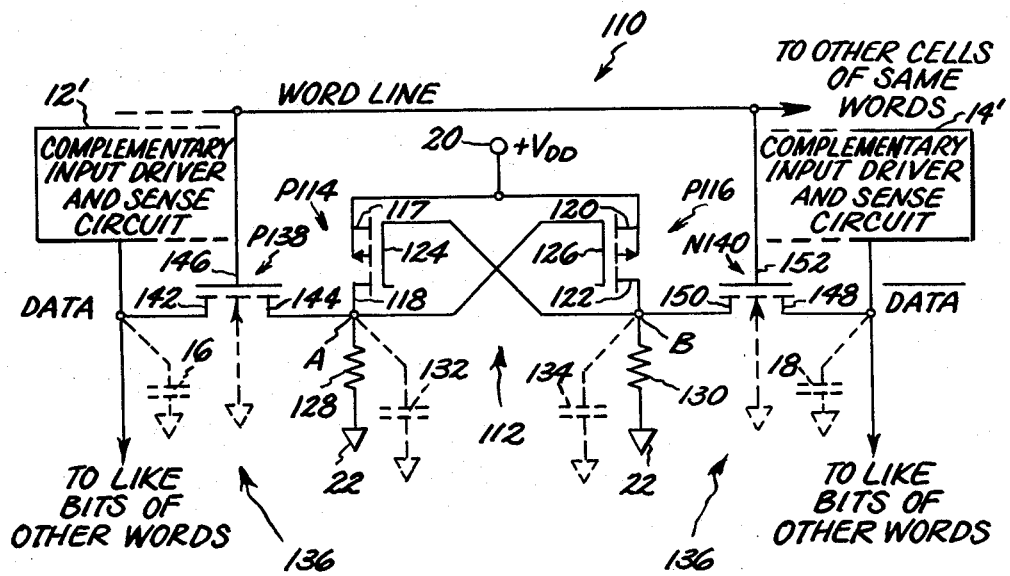
FIG. 2 is an electrical schematic diagram depicting one embodiment of a memory cell in accordance with the invention.

Considering now memory cells in accordance with the present invention, FIG. 2 is an electrical schematic diagram of one memory cell 110 in accordance with the invention. It may be noted that specific structure to implement the cell 110 of FIG. 2 is described hereinbelow with reference to FIG. 4.

The FIG. 2 cell 110 is included in a memory array in the same manner as is described above with reference to the prior art cell 10, and the description of the overall memory arrangement will accordingly not be repeated. In general, the requirements imposed on the external circuitry by the cell 110 correspond to those of the cell 10, with the exception that, for a reading operation, the DATA and $\overline{\text{DATA}}$ lines are precharged to logic low. Accordingly, the two halves 12' and 14' of the complementary input driver and sense circuitry are designated by primed reference numerals in FIG. 2 to designate general correspondence with elements 12 and 14 of FIG. 1, but slightly different operation during the precharge portion of the memory cell reading cycle.

In detail, the memory cell 110 includes a pair of voltage supply nodes 20 and 22, one 20 of which is at $+V_{DD}$ potential and the other 22 of which is at ground potential. The cell includes first and second complementary data input/output nodes A and B respectively corresponding to the DATA and $\overline{\text{DATA}}$ lines.

The cell 110 includes a latch, generally designated 112, including a pair of P-channel IGFETs, P114 and P116, the channels of which are respectively arranged to selectively electrically connect the data nodes A and B to $+V_{DD}$ potential. More particularly, one latch transistor P114 has a source terminal 117 and a drain terminal 118 connected respectively to $+V_{DD}$ and to the data node A, and the other latch transistor P116 has a source terminal 120 and a drain terminal 122 connected respectively to $+V_{DD}$ and the second data node B. To provide a bistable latching configuration, the latch transistors P114 and P116 are cross-coupled with the gate 124 of the one latch transistor P114 being connected to node B and thus to the drain 122 of the other latch transistor P116, and the gate 126 of the other latch transistor P116 being connected to the data node A and thus to the drain 118 of the one latch transistor P114.

Respectively electrically connecting the first and second data nodes A and B to the other of the voltage supply nodes, i.e. circuit reference potential 22, are first and second high impedance leakage current discharge paths, depicted as representative leakage discharge resistors 128 and 130. In contrast to the load resistors 28 and 30, and as will hereinafter become apparent, the resistances 128 and 130 serve no function either in charging or discharging the data nodes A and B, or in charging or discharging respective parasitic capacitances 132 and 134 associated with the data nodes A and B. While various alternatives are described in some detail hereinafter, at this point it may be noted that the discharge resistances 128 and 130 may be formed in a variety of ways in accordance with the invention, as well as in any of the methods conventional for forming the load resistors 28 and 30 in cells such as the FIG. 1 prior art memory cell 10. In the memory cell 110 of the present invention there is greater flexibility in forming the resistances 128 and 130 since the impedance may be in the order of thousands of megohms, and the resistance value tolerance is not at all critical. In some embodiments, the resistances 128 and 130 need not comprise discrete resistors at all, but merely leakage paths introduced into the integrated circuit device through suitable processing during manufacture. In such case the resistances do not occupy any additional area of the integrated circuit chip. Again, the resistors 128 and 130 may be of much higher impedance as described above. As a result, the present invention provides memory cells with reduced power dissipation and characterized by relatively fast writing speed.

The cell 110 further includes a gating circuit, generally designated 136, including a pair of N-channel IGFETs N138 and N140 functioning as transmission gates to selectively electrically connect the first data node A to the DATA line and the second data node B to the $\overline{\text{DATA}}$ line. The gating transistor N138 has a pair of main terminals 142 and 144, as well as a gate terminal 146 connected to the WORD line for controlling conduction through the channel of the transistor N138. Similarly, the gating transistor N140 has a pair of main terminals 148 and 150, as well a gate terminal 152 also connected to the WORD line for controlling conduction through the channel of the transistor N140. One main terminal 142 of one gating transistor N138 is connected to the DATA line, and the other main terminal 144 of the one gating transistor 138 is connected to the data node A. Similarly, one main terminal 148 of the other gating transistor N140 is connected to the $\overline{\text{DATA}}$ line, and the other main terminal 150 of the other gating transistor N140 is connected to the data node B.

In FIG. 2, it is significant to note that the gating transistors N138 and N140 are of opposite channel conductivity type with respect to the latching transistors P114 and P116. As will be apparent from the description of the operation which follows next, below, this difference along with the location of the latching transistors in circuit provides a significant advantage in the operation of writing data into the memory cell 110. In particular, whether writing a logic high or logic low into a particular node, the turning OFF of a particular one of the gating transistors N138 or N140 because its gate terminal voltage no longer exceeds its source terminal voltage by a threshold voltage $V_T$ does not result in a failure to either fully charge or fully discharge the associated node, as the case may be, and there is no reliance upon the resistances 128 and 130 for this purpose.

By way of example, the operation of writing a binary "1" into the memory cell 110 will first be considered. In this example, the data node A is initially assumed to be at logic low with the parasitic capacitance 132 fully discharged, and the data node B is assumed to be initially at logic high, with the parasitic capacitance 134 fully charged. Under these conditions, the latch transistor P114 is OFF, its gate terminal 124 being high by virtue of its cross-coupling to data node B. The latch transistor P116 is ON because its gate terminal 126 is at logic low by virtue of its cross-coupling to data node A, and therefore is more negative than the transistor P116 source terminal 120.

To begin the write cycle operation, the circuitry 12' and 14' drives the DATA and $\overline{\text{DATA}}$ lines to logic high and logic low levels respectively, thus charging the parasitic capacitance 16 and discharging the parasitic capacitance 18. The WORD line is then driven high, applying logic high ($+V_{DD}$) voltage to the gates 146 and 152 of the gating transistors N138 and N140.

Considering first the data node A, the gating transistor N138 terminal 144 is negative with respect to the terminal 142, and the terminal 144 therefore functions as the IGFET source terminal. The transistor N138 conducts in the source-follower mode (subject to the threshold voltage $V_T$ offset between the gate 146 and source 144 terminals), and at least begins pulling the data node A towards $+V_{DD}$ (logic high). Although the threshold voltage offset causes transistor N138 to turn OFF before node A is pulled fully to logic high, data node A goes sufficiently high to at least partially turn OFF the other latch transistor P116, since the transistor P116 gate 126 is coupled to data node A. With transistor P116 partially OFF, the data node B is allowed to go low (when suitably driven low).

At the same time, the data node B is being pulled low through the other gating transistor N140 to the $\overline{\text{DATA}}$ line. For this operation, the one main terminal 148 of the transistor N140 may be viewed as the source terminal since it is more negative than the other main terminal 150, which correspondingly may be viewed as the drain terminal. The other gating transistor 140 is thus gated fully ON, the gate 152 being clearly more positive than the source 148, and threshold voltage $V_T$ offset not being a factor. Accordingly, the second data node B is pulled low through the other gating transistor N140, and the parasitic capacitance 134 discharges. As the second data node B goes sufficiently low, by virtue of the cross-coupled connection to the gate 124 of the one latch transistor P114, the latch transistor P114 turns ON because its gate 124 becomes sufficiently more negative than its source 117. With latch transistor P114 conducting, the first data node A is then actively pulled up, all the way to $+V_{DD}$, and the parasitic capacitance 132 fully charged.

It is significant to note, in the operation just described, that the data node A is actively pulled fully to logic high through transistor P114, without reliance on any load resistor. It is only initially that node A is pulled towards logic high through the gating transistor N138. By the time the transistor N138 turns off due to threshold voltage $V_T$ offset between its gate 146 and source 144 terminals, conduction through the one latch transistor P114 has taken over to complete the task of pulling node A to logic high ($+V_{DD}$).

In addition, data node B is pulled fully to logic low through the other gating transistor N140 to the $\overline{\text{DATA}}$ line, threshold voltage $V_T$ offset between the transistor N140 gate 152 and source 148 not being a factor. Thus the leakage discharge resistance 130 serves no function in pulling the data node B low, and merely serves subsequently to maintain the data node B at logic low by discharging any leakage current, for example, through the other latch transistor P116.

It will be appreciated that the complementary case, i.e. writing a binary "0" into the memory cell 110 proceeds in an equivalent manner, with the first data node A being pulled to logic low through the one gating transistor N138, eventually turning on the other latch transistor P116 to actively pull up the second data node B, while at the same time the $\overline{\text{DATA}}$ line and the other gating transistor N140 begin the task of pulling up the data node B and charging the parasitic capacitance 134.

To summarize the operation of writing into the FIG. 2 memory cell 110, when writing a binary "1", the DATA line is high and $\overline{\text{DATA}}$ line is low. The gating transistor N140 is fully on, and node B is fully discharged through the gating transistor N140 to the $\overline{\text{DATA}}$ line. At the same time, the data node A begins to charge from the DATA line through the gating transistor N138. Before the gating transistor N138 cuts OFF due to threshold voltage offset, the one latch transistor P114 begins conducting, actively pulling up the first data node A. Neither resistance 128 nor resistance 130 plays any part.

In contrast, in the prior art memory cell 10 of FIG. 1, once the gating transistor N50 cuts off due to threshold voltage offset, there is no longer any mechanism for actively pulling up the node A, and current flow through the load resistor 28 must be relied upon.

The operation of reading from the memory cell 110 of FIG. 2, summarized next, proceeds in a manner similar to that described above with reference to FIG. 1, with the exception that the DATA and $\overline{\text{DATA}}$ lines must be precharged to logic low by the circuitry 12' and 14'.

Assuming for purposes of example that a binary "0" is stored in the FIG. 2 memory cell 110, node A is at logic low and node B is at logic high. When the WORD line goes high, the one gating transistor N138 is turned ON because its gate 146 is positive with respect to both its main terminals 142 and 144. Since the data node A is already low, it does not change the level on the DATA line, which remains at logic low. In the case of the other gating transistor N140 connected to the data node B which is at logic high, the terminal 148 may be viewed as the source terminal because it is more negative than the other terminal 150, which accordingly may be viewed as the drain terminal. the $\overline{\text{DATA}}$ line is then pulled towards $+V_{DD}$ through the other gating transistor N140 and the other latch transistor P116. Due to threshold voltage offset in the other gating transistor N140, the $\overline{\text{DATA}}$ line cannot be pulled all the way to $+V_{DD}$. However, with suitable sense circuitry 12' and 14', no particular problem is presented, and the cell 110 is properly read.

Figure 3:
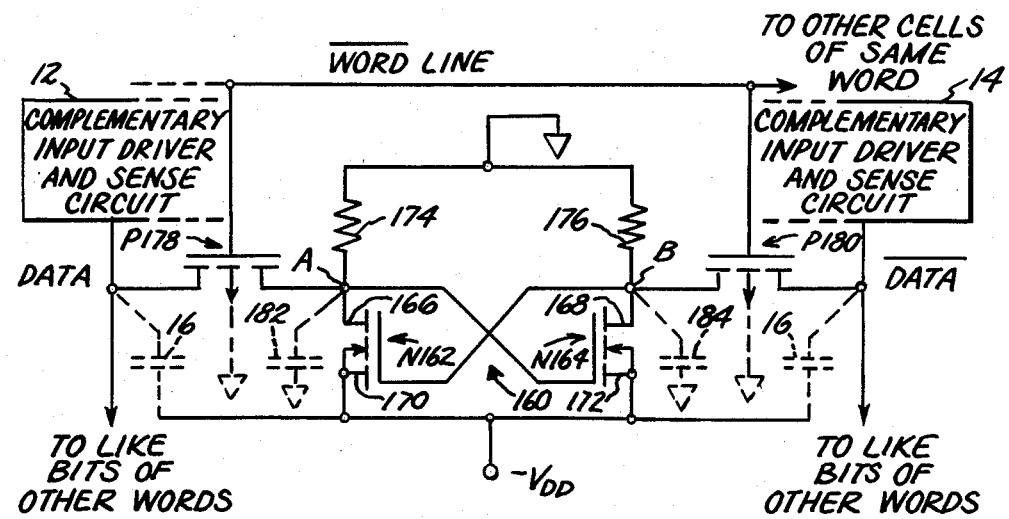
FIG. 3 is an electrical schematic diagram showing another form of memory cell in accordance with the invention.

With reference now to FIG. 3, depicted is another form of memory cell 160, also embodying the invention. To operate the FIG. 3 memory cell 160, the complementary input driver and sense circuitry 12 and 14 may be the same as that employed to drive the FIG. 1 cell 10, inasmuch as the FIG. 3 memory cell 160 requires that the DATA and $\overline{\text{DATA}}$ lines be precharged to a logic high level (ground) prior to a memory reading operation. To enable or address the memory cell 160, a complementary logic level is required; hence, the FIG. 3 memory cell 160 is enabled by a $\overline{\text{WORD}}$ line, which goes low ($-V_{DD}$) to address the cell 160.

The cell 160 includes a pair of cross-coupled N-channel IGFETs N162 and N164, the drains 166 and 168 of which are connected to the data nodes A and B, and the sources 170 and 172 of which are connected to $-V_{DD}$ (logic low). Leakage current discharge resistance 174 and 176 are connected between the ground terminal and the data nodes A and B.

In FIG. 3, a pair of P-channel gating IGFETs P178 and P180 are employed, respectively having their channels arranged to selectively connect the DATA line to the data node A, and the $\overline{\text{DATA}}$ line to the data node B.

The memory cell 160 of FIG. 3 operates in a manner similar to that of the memory cell 110 of FIG. 2, with the exceptions that the $\overline{\text{WORD}}$ line is normally high (ground) and goes low ($-V_{DD}$) to turn on the gating transistors P178 and P180, and the DATA and $\overline{\text{DATA}}$ lines are precharged to a logic high level (ground) at the beginning of a reading operation.

The operation of writing a binary "1" into the memory cell 160 of FIG. 3 will now be summarized by way of example. In this example, the data node A is initially low $-V_{DD}$, with the latch transistor N162 ON, and the data node B is high (ground), with the latch transistor N164 OFF. The circuitry 12 and 14 drives the DATA line high (ground) and the $\overline{\text{DATA}}$ line low ($-V_{DD}$), and then the $\overline{\text{WORD}}$ line is driven low ($-V_{DD}$) to turn on the gating transistors P178 and P180. Under these conditions, the gating transistor P180 operates in the source-follower mode to begin pulling the data node B low ($-V_{DD}$) by charging the parasitic capacitance 184, and thus partly turning OFF the cross-coupled latch transistor N162. At the same time, the gating transistor P178, operating in the common-source mode, begins to pull the data node A to logic high (ground), discharging the parasitic capacitance 182, the voltage on the data node A being allowed to increase all the way to ground when the latching transistor N162 turns OFF. It will be appreciated that the threshold voltage $V_T$ offset causes the gating transistor P180 to turn OFF before the data node B fully reaches logic low; however, before the gating transistor P180 ceases conducting, the latch transistor N164 is turned ON by virtue of its gate (cross-coupled) to node A going high (ground). Accordingly data node B is actively pulled fully low ($-V_{DD}$), fully discharging the parasitic capacitance 184.

Figure 4:
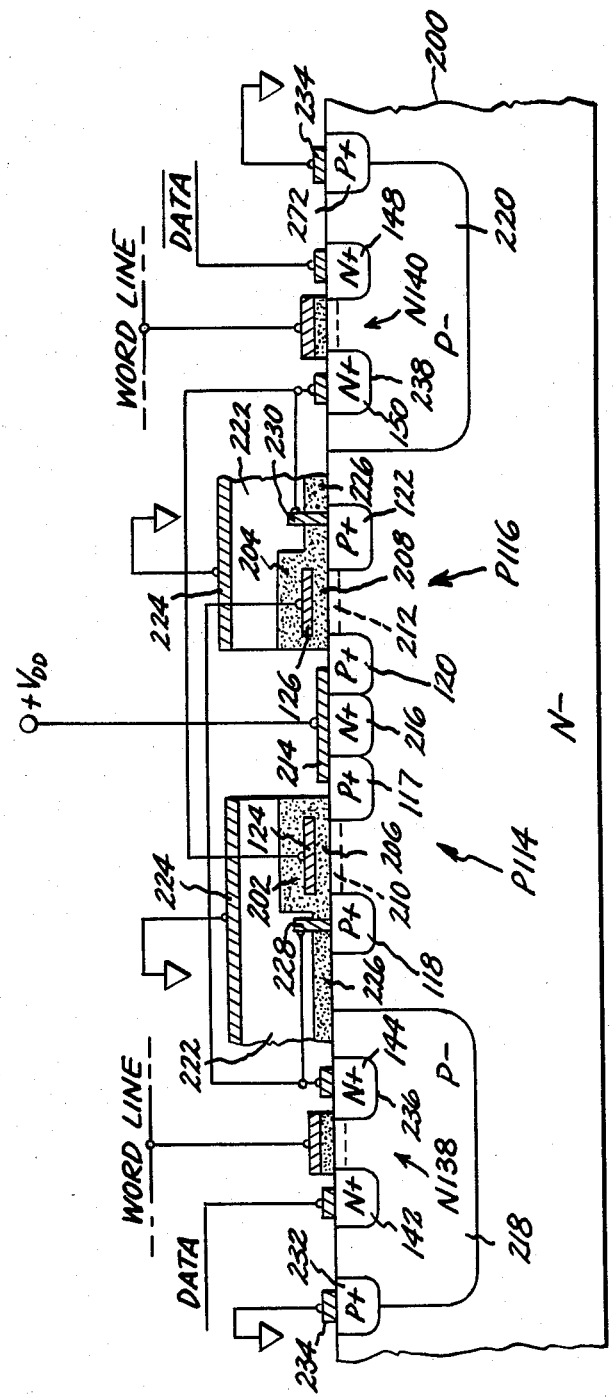
FIG. 4 is a highly schematic cross-sectional representation of the physical structure of a memory cell in accordance with the invention and corresponding to the circuit of FIG. 2.

With reference now to FIG. 4, a specific structure implementing the circuit of FIG. 2 will now be described, followed by a description of various ways in accordance with the invention in which the leakage discharge resistances 128 and 130 may be formed in actual circuits.

For convenience, identical reference numerals are used in FIG. 4 to designate structural elements corresponding to symbols in the electrical schematic circuit diagram of FIG. 2. It will be appreciated that, while FIG. 4 depicts one exemplary structure, it is nevertheless a highly schematic depiction, omitting a number of conventional features required in practical devices, as will be appreciated by those skilled in the art. Also, FIG. 4 is a cross-sectional view only, and indicates the required surface metallization pattern in a schematic manner only.

The memory cell structure of FIG. 4 is formed on a portion 200 of an N$^-$ conductivity type silicon semiconductor substrate or wafer which, as will be appreciated, is but a small portion of an overall integrated circuit memory substrate including a multiplicity of individual memory cells. The latch IGFETs P114 and P116 are provided, in conventional fashion, by forming P+ conductivity type source regions 117 and 120 and P+ conductivity type drain regions 118 and 122 within the substrate 200. These P+ conductivity type regions are formed employing conventional techniques. The latch transistor P114 and P116 gate electrodes 124 and 126 are encased in suitable insulating oxide layers 202 and 204, including oxide portions 206 and 208 serving as the gate insulating layer. The gate electrodes 124 and 126 themselves may comprise any suitable conductive material, such as molybdenum or highly-doped polycrystalline silicon. Since the IGFETs P114 and P116 are enhancement mode devices, conduction channels only exist when induced by suitable voltages on the gate electrodes 124 and 126, these induced conduction channels being represented at 210 and 212.

The $+V_{DD}$ connection to the IGFET P114 and P116 source regions 117 and 120 is accomplished by means of an ohmic contact to a $+V_{DD}$ electrode 214. Additionally, in order to bias the substrate 200 at $+V_{DD}$ and also to connect sources 117 and 120 to the substrate, an N+ conductivity type region 216 is formed at the substrate surface 200, also in ohmic contact with the electrode 214.

The N-channel gating IGFETs N138 and N140 are similarly formed within the substrate 200. However, since the gating transistors N138 and N140 are of opposite channel conductivity type with respect to the latch transistors P114 and P116, a separate well region must be provided for one of the pairs of transistors. In the illustrated embodiment, a separate well region comprising P− conductivity type portions 218 and 220 is formed within the substrate 200 prior to the forming of N+ conductivity type main terminal regions 142 and 144 of the transistor N138 and the N− conductivity type main terminal regions 148 and 150 of the transistor N140. P+ region 232 in well region 218 with electrode 234 thereon connects well region 218 to ground. Also, P+ region 232 in well region 220 with electrode 234 thereon connects well region 220 to ground.

As noted above, various techniques may be employed for forming the leakage discharge resistances 128 and 130, several of these techniques being depicted in FIG. 4.

One of these techniques involves a resistive sea formed generally above the cell 110 and comprising a layer 222 of high-resistivity polycrystalline silicon, for example, undoped, intrinsic polycrystalline silicon. A ground electrode 224 is formed on the top surface of the resistive sea 222 in electrical contact therewith and connected to the ground reference potential at 222. The resistive sea 222 is insulated from the substrate 200 by an insulating oxide layer 226, which may be viewed as conventional field oxide.

To complete the structure of the leakage current discharge paths, first and second impedance electrodes 228 and 230 are provided, respectively connected to either the latch transistor drain regions 118 and 122, or the grating transistor main terminal regions 144 and 150 (which, as will be appreciated, are electrically connected to each other), and extending through the insulating layer 226 an electrical contact with the high resistivity polycrystalline silicon layer 222.

The impedance of the resistive sea 222 is at least sufficient to ensure that all nodes not connected to $+V_{DD}$ through a transistor will leak to ground. The resistive sea 222 can cover all or selected portions of the circuit.

The high impedance leakage current discharge paths 128 and 130 for maintaining the data nodes A and B at ground need not comprise the resistive sea 222, nor need they even comprise identifiable resistors. In particular, other leakage paths can be provided in the cell 110, such as, through the gating transistors N138 and N140.

As one example, the well regions 218 and 220 can be connected to ground potential by means of P+ conductivity type contact regions 232 having electrodes 234 connected to ground potential. Thus, reverse-biased PN junction diodes, generally designated 236 and 238 in FIG. 4, are formed between the transistor N138 and N140 terminal regions 144 and 150 and circuit ground. Through suitable process design, these diodes 236 and 238 can be made sufficiently leaky to discharge the nodes A and B. Another way of stating this is that the leakage of the gating transistors N138 and N140 exceeds the leakage of the latch transistors P114 and P116.

Another leakage path within the gating transistors N138 and N140 which can comprise the leakage current discharge paths for the data nodes A and B is between the main terminals 142 and 144, and 148 and 150. This leakage, then, is from the data nodes A and B to the DATA and $\overline{\text{DATA}}$ lines. This leakage path also may be provided through suitable process design. The circuit function, particularly that of the circuitry 12′ and 14′ (FIG. 2) must be such that the DATA and $\overline{\text{DATA}}$ lines are generally maintained at their precharged (logic low) level, if long periods of static operation are desired without loss of data.

Figure 5:
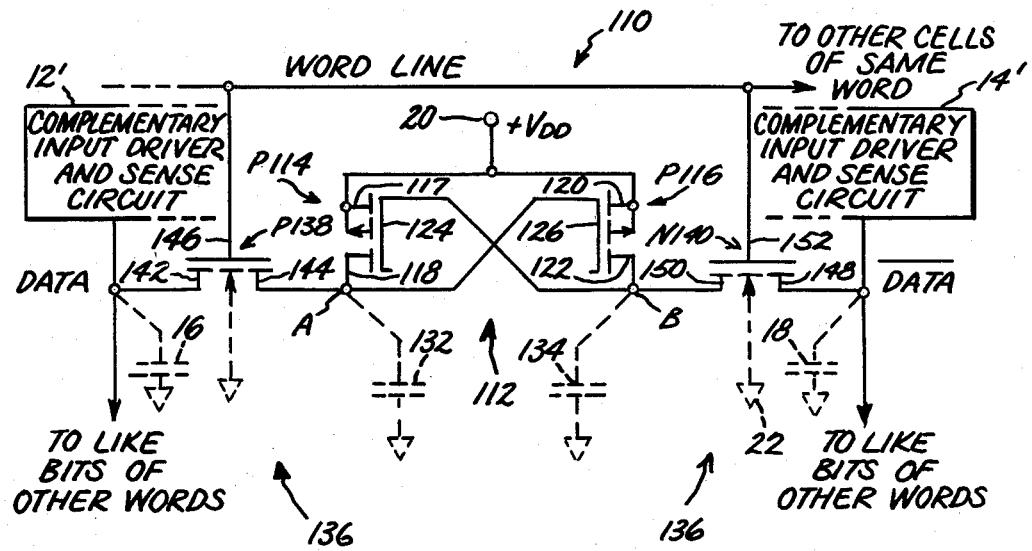
FIG. 5 is an electrical schematic diagram depicting another embodiment of a memory cell in accordance with the invention.

Operation of the cell, such as shown in FIG. 2, having no leakage paths at all to ground is possible, but the storage of data in such a structure is not possible for long periods of time, in general, and it would therefore constitute a dynamic memory. Such a cell is shown in FIG. 5 which is identical to the cell of FIG. 2 with the leakage current discharge resistances 128 and 130 eliminated. Such dynamic memories may be utilized, however, when desired provided a read cycle which restores the data is performed sufficiently often so that no data is lost. Dynamic memories are well known in the art.

While specific embodiments of the invention have been illustrated and described herein, it is realized that numerous modifications and changes will occur to those skilled in the art. It is therefore to be understood that the appended claims are intended to cover all such modifications and changes as fall within the true spirit and scope of the invention.

What is claimed is:

1. A binary memory cell for connection to first and second complementary data input/output lines and to a word line carrying cell-enabling signals, said memory cell comprising:

a pair of voltage supply nodes;

first and second complementary data input/output nodes;

a latch including a pair of insulated-gate field-effect transistors of one channel conductivity type, the channel of one of said latch transistors arranged to selectively electrically connect said first data node to one of said voltage supply nodes, the channel of the other of said latch transistors arranged to selectively electrically connect said second data mode to the one of said voltage supply nodes, the gate of the one latch transistor being electrically connected to said second data node, and the gate of the other latch transistor being electrically connected to said first data node; and a gating circuit including a pair of insulated-gate field-effect transistors of opposite channel conductivity type, the channel of one gating transistor arranged to selectively electrically connect said first data node to the first data line, the channel of the other gating transistor arranged to selectively electrically connect said second data node to the second data line, and the gates of said gating transistors arranged for connection to the word line for controlling conduction through the channels of said gating transistors.

2. A memory cell in accordance with claim 1 including first and second high impedance leakage current discharge paths respectively electrically connecting said first and second data nodes to the other of said voltage supply nodes.

3. A memory cell in accordance with claim 2, wherein:
said one of said pair of voltage supply nodes is a positive voltage supply node with respect to said other of said pair of voltage supply nodes;
said latch transistors are P-channel insulated-gate field-effect transistors; and
said gating transistors are N-channel insulated-gate field-effect transistors.

4. A memory cell in accordance with claim 2, wherein said leakage current discharge paths comprise a resistive sea having portions in electrical contact with said data nodes and a portion in electrical contact with said other of said voltage supply nodes.

5. A memory cell in accordance with claim 3, wherein said leakage current discharge paths comprise a resistive sea having portions in electrical contact with said data nodes and a portion in electrical contact with said other of said voltage supply nodes.

6. A memory cell in accordance with claim 2, wherein said first leakage current discharge path comprises a leakage path included within the one gating transistor between said first data node and said other of said voltage supply nodes, and wherein said second leakage current discharge path comprises a leakage path included within the other gating transistor between said second data node and said other of said voltage supply nodes.

7. A memory cell in accordance with claim 3, wherein said first leakage current discharge path comprises a leakage path included within the one gating transistor between said first data node and said other of said voltage supply nodes, and wherein said second leakage current discharge path comprises a leakage path included within the other gating transistor between said second data node and said other of said voltage supply nodes.

8. A memory cell in accordance with claim 2, wherein said first leakage current discharge path comprises a leakage path included within the one gating transistor between said first data node and the first data line, and wherein said second leakage current discharge path comprises a leakage path included within the other gating transistor between said second data node and the second data line, such that said data nodes are discharged when the data lines are at the potential of said other voltage supply node.

9. A memory cell in accordance with claim 3, wherein said first leakage current discharge path comprises a leakage path included within the one gating transistor between said first data node and the first data line, and wherein said second leakage current discharge path comprises a leakage path included within the other gating transistor between said second data node and the second data line, such that said data nodes are discharged when the data lines are at the potential of said other voltage supply node.

10. In an integrated circuit memory formed on a semiconductor substrate and including a pair of voltage supply lines, first and second complementary data input/output lines, and a word line carrying cell-enabling signals, a memory cell comprising:

a latch including a pair of insulated-gate field-effect transistors of one channel conductivity type, each latch transistor including a source region and a drain region of the one conductivity type formed within the substrate, and including an insulated gate electrode on the substrate configured for inducing a conduction channel between said source region and said drain region, said latch transistor source regions electrically connected to each other and to one of the pair of voltage supply lines, said gate electrode of one of said latch transistors being electrically connected to said drain region of the other latch transistor, said gate electrode of the other latch transistor being electrically connected to said drain region of the one latch transistor, and said latch transistor drain regions respectively defining first and second data input/output nodes;

a gating circuit including a pair of insulated-gate field-effect transistors of opposite channel conductivity type, each gating transistor including a pair of main terminal regions of the opposite conductivity type formed within the substrate, and including an insulted gate electrode on the substrate configured for inducing a conduction channel between said main terminal regions, one of said main terminal regions of one of said gating transistors electrically connected to the first data line, the other of said main terminal regions of the one gating transistor electrically connected to said first latch transistor drain region, one of said main terminal regions of the other gating transistor electrically connected to the second data line, the other of said main terminal regions of the other gating transistor electrically connected to said second latch transistor drain region, and said data electrodes of said gating transistors electrically connected to the word line for controlling conduction between said main terminal regions of said gating transistors;

one of said pairs of transistors being formed within at least one well region of opposite conductivity type with respect to the channel conductivity type of said transistors of said one pair, and said well region being in turn formed within the substrate; and first and second high impedance leakage current discharge paths respectively electrically connecting said first and second data nodes to the other of the pair of voltage supply lines.

11. A memory cell in accordance with claim 10, wherein:
said latch transistor source regions are electrically connected to a voltage supply line which is positive with respect to the other voltage supply line;
said latch transistors are P-channel insulated-gate field-effect transistors having P conductivity type source and drain regions; and
said gating transistors are N-channel insulated-gate field-effect transistors having N conductivity type main terminal regions.

12. A memory cell in accordance with claim 10, wherein said one of said pairs of transistors formed within at least one well region is said pair of gating transistors.

13. A memory cell in accordance with claim 11, wherein said one of said pairs of transistors formed within at least one well region is said pair of gating transistors, and said well region is of P conductivity type.

14. A memory cell in accordance with claim 10, wherein said leakage current discharge paths comprise:
- a layer of high-resistivity polycrystalline silicon covering at least portions of the substrate and electrically insulated from the substrate by an insulating layer;
- a ground electrode in electrical contact with said high-resistivity polycrystalline silicon layer and electrically connected to said other of the pair of voltage supply lines;
- a first impedance electrode electrically connected to one of said one latch transistor drain region or said one gating transistor other main terminal region and extending through said insulating layer in electrical contact with said high-resistivity polycrystalline silicon layer; and
- a second impedance electrode electrically connected to one of said other latch transistor drain region or said other gating transistor other main terminal region and extending through said insulating layer in electrical contact with said high-resistivity polycrystalline silicon layer.

15. A memory cell in accordance with claim 11, wherein said leakage current discharge paths comprise:
- a layer of high-resistivity polycrystalline silicon covering at least portions of the substrate and electrically insulated from the substrate by an insulating layer;
- a ground electrode in electrical contact with said high-resistivity polycrystalline silicon layer and electrically connected to said other of the pair of voltage supply lines;
- a first impedance electrode electrically connected to one of said one latch transistor drain region or said one gating transistor other main terminal region and extending through said insulating layer in electrical contact with said high-resistivity polycrystalline silicon layer; and
- a second impedance electrode electrically connected to one of said other latch transistor drain region or said other gating transistor other main terminal region and extending through said insulating layer in electrical contact with said high-resistivity polycrystalline silicon layer.

16. A memory cell in accordance with claim 12, wherein said leakage current discharge paths comprise:
- an electrical connection between said well region and the other of the voltage supply lines such that a reverse-biased PN junction diode is defined within each of said gating transistors between each of said one main terminal regions and said well region;
- said gating transistors being configured to have leakage through the defined PN junction diodes sufficient to discharge leakage current on said nodes.

17. A memory cell in accordance with claim 13, wherein said leakage current discharge paths comprise:
- an electrical connection between said well region and the other of the voltage supply lines such that a reverse-biased PN junction diode is defined within each of said gating transistors between each of said one main terminal regions and said well region;
- said gating transistors being configured to have leakage through the defined PN junction diodes sufficient to discharge leakage current on said nodes.

18. A memory cell in accordance with claim 10, wherein said leakage current discharge paths are included within said gating transistors between said gating transistor main terminal regions, said gating transistors being configured to have leakage sufficient to discharge leakage current on said nodes when the data lines are at the potential of the other voltage supply line.

19. A memory cell in accordance with claim 11, wherein said leakage current discharge paths are included within said gating transistors between said gating transistor main terminal regions, said gating transistors being configured to have leakage sufficient to discharge leakage current on said nodes when the data lines are at the potential of the other voltage supply line.

* * * * *